(12) United States Patent
Mouzannar et al.

(10) Patent No.: US 6,788,149 B2
(45) Date of Patent: Sep. 7, 2004

(54) BROAD-BAND BIASING SYSTEM FOR BIASING AN ELECTRONIC CIRCUIT AND AN AMPLIFIER INCORPORATING THE SYSTEM

(75) Inventors: Wissam Mouzannar, Palaiseau (FR); René Lefevre, Marly le Roy (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 10/178,539

(22) Filed: Jun. 25, 2002

(65) Prior Publication Data

US 2003/0006846 A1 Jan. 9, 2003

(30) Foreign Application Priority Data

Jun. 28, 2001 (FR) .............................. 01 08543

(51) Int. Cl.⁷ .............................. H03F 3/04; H03F 3/60
(52) U.S. Cl. ......................................... 330/296; 330/54
(58) Field of Search ............................ 330/296, 54, 286

(56) References Cited

U.S. PATENT DOCUMENTS

| | | | | |
|---|---|---|---|---|
| 5,055,795 A | * | 10/1991 | Kasper et al. | 330/54 |
| 5,208,547 A | * | 5/1993 | Schindler | 330/54 |
| 5,386,130 A | * | 1/1995 | Gamand et al. | 257/275 |
| 6,049,250 A | * | 4/2000 | Kintis et al. | 330/54 |
| 6,342,815 B1 | * | 1/2002 | Kobayashi | 330/286 |
| 6,400,266 B1 | * | 6/2002 | Brown, Jr. | 340/542 |
| 6,472,941 B2 | * | 10/2002 | Shigematsu | 330/286 |

FOREIGN PATENT DOCUMENTS

| | | |
|---|---|---|
| EP | 0 237 099 A1 | 9/1987 |
| WO | WO 9910987 | 3/1999 |

OTHER PUBLICATIONS

A. Cappello et al, "A High Performance, Quasi–Monolithic 2 to 18 GHz Distributed Gaas FET Amplifier", IEEE MTT–S International Microwave Symposium Digest, Las Vegas, Jun. 9–11, 1987, International Microwave Symposium, NY, IEEE, vol. 2, Jun. 9, 1987, pp. 833–836, XP000094051.

* cited by examiner

Primary Examiner—Patricia Nguyen
(74) Attorney, Agent, or Firm—Moser, Patterson & Sheridan, L.L.P.

(57) ABSTRACT

A biasing system for biasing an electronic circuit includes a resistance connected in series with a transmission line which has a characteristic impedance substantially equal to the resistance and comprises a conductive line and a plurality of current sources distributed along the conductive line. The biasing system can be used as a biasing and/or matching supply for any type of broad-band low-noise power application requiring high bias currents.

11 Claims, 2 Drawing Sheets

BROAD-BAND BIASING SYSTEM FOR BIASING AN ELECTRONIC CIRCUIT AND AN AMPLIFIER INCORPORATING THE SYSTEM

CROSS-REFERENCE TO RELATED APPLICATIONS

This application is based on French Patent Application No. 01 08543 filed Jun. 28, 2001, the disclosure of which is hereby incorporated by reference thereto in its entirety, and the priority of which is hereby claimed under 35 U.S.C. §119.

BACKGROUND OF THE INVENTION

1. Field of the Invention

The present invention relates to a biasing system for biasing an electronic circuit. The invention relates more particularly to a broad-band distributed active load used as a biasing supply for biasing electronic circuits for microwave broad-band low-noise power applications, for example power amplifier electronic circuits.

2. Description of the Prior Art

Broad-band integrated power amplifiers operating at frequencies from DC to frequencies in excess of 100 GHz are very widely used in high bit rate (greater than 40 Gbit/s) optical fiber transmission systems.

For example, they are used to control electro-optical modulators, which are optical devices in which the propagation of light can be modified by applying a particular electrical field, typically with a peak-to-peak amplitude of 3 volts in the case of an electro-absorption modulator and more than 6 volts in the case of a lithium-niobate modulator.

High-voltage control circuits providing broad-band power amplification are required for controlling optical devices of this type.

These control circuits are generally based on distributed amplifier architectures.

A distributed power amplifier has an inherently high product of the gain and the bandwidth.

FIG. 1 shows the operating principle of this kind of amplifier. Amplifier stages T1 to Tn are regularly distributed along an input transmission line GL and an output transmission line DL. Each transmission line comprises a respective conductive line GL and DL and components connected along it.

Each amplifier stage comprises a field-effect transistor, for example a metal semiconductor field-effect transistor (MESFET).

The two transmission lines GL and DL are therefore called the gate line and the drain line.

However, bipolar transistors can be substituted for the field-effect transistors in each amplifier stage T1 to Tn.

In this case, the two transmission lines along which the amplifier stages are distributed are called the base line and the collector line.

The distributed amplifier operates as follows: the input signal to be amplified propagates along the gate line GL and is absorbed by the load Rg, whose impedance is substantially equal to the characteristic impedance of the transmission line. The characteristic impedance of the transmission line includes the impedance of the conductive line and the equivalent impedances of the components connected to it.

If the load on a transmission line has an impedance equal to the characteristic impedance of the line, the line typically behaves like a line of infinite length.

In other words, no energy can be reflected back to the input of the gate line GL.

A voltage wave propagating from left to right therefore passes the gate G of each transistor T1 to Tn constituting the amplifier stages.

A current is then generated by each transistor and feeds the drain line DL. Half of this current propagates to the load Rd and the other half to the output. The half of the current from each transistor that propagates to the output is superposed with that from each of the other transistors with the same phase provided that the inter-cell propagation times on the drain line DL and the gate line GL are identical. The overall amplification factor is then the sum of the respective amplification factors of each transistor.

The signal propagated back toward the internal load Rd of the drain line DL is totally absorbed provided that the load Rd is tuned to (i.e. has an impedance equal to) the characteristic impedance of the transmission line DL.

Accordingly, in this distributed power amplifier output line, the portion of the injected current flowing to the internal load Rd is dissipated and lost and no energy is reflected toward the output load.

This condition is essential for preventing ripple on the frequency response and echo in the impulse response and also for preserving the performance of the distributed power amplifier, in particular its linearity. Non-linearity in an amplifier is a major cause of distortion.

Distributed amplifiers like those previously described require a high bias current, in excess of 100 mA, to deliver the required output voltage.

They must supply a high current and many transistors must therefore be used, as a result of which the bias currents are high.

In many applications, the problem then arises of biasing the transistors constituting the amplifier stages distributed along two transmission lines without degrading the performance of the distributed amplifier.

Until now, two prior art solutions have been used for biasing a distributed amplifier. They are described in "Fundamentals of distributed amplification", by Thomas T. Y. Wong, Artech House, Boston & London, 1993.

However, in the context of the present invention, relating more particularly to broad-band power applications, none of the prior art solutions described in the above work is entirely satisfactory.

First of all, a first solution consists of biasing the drain of the transistors forming each amplifier stage of the distributed amplifier with the output of the drain line DL (see FIG. 2).

This figure does not show the amplifier stages or the gate transmission line.

Accordingly, a bias voltage is applied via a standard "T" bias circuit 1 at the output of the distributed amplifier.

The bias circuit includes a decoupling capacitor 2 and a high-inductance choke coil 3.

The function of the decoupling capacitor 2 is to isolate the output of the distributed amplifier from the direct current bias voltage.

At the output of the amplifier are various modules, such as electro-optical modulators, for example.

The function of the choke coil 3 is to block the high-frequency component of the current whilst allowing the low-frequency component to pass through it, so as not to interfere with the operation of the broad-band power amplifier at microwave frequencies.

However, although this conventional circuit for biasing a distributed amplifier supplies a satisfactory bias current to the transistors forming the amplifier stages along the transmission line, it has a number of drawbacks.

First of all, the circuit is not integrated. It is therefore external to the distributed amplifier integrated circuit. Apart from the space it requires, due essentially to the large size of the choke coil, this type of circuit necessitates the use of a separate module.

Moreover, in some applications, for example applications in which the distributed amplifier output controls an electro-optical modulator, a second "T" bias circuit is needed to bias the electro-optical modulator.

This solution is therefore nowhere near optimum in terms of integration capacity.

Another standard prior art solution consists of biasing the transistors directly via the drain resistance Rd of the drain line DL (see FIG. 3).

As in FIG. 2, the amplifier stages of the distributed amplifier and the gate line are not shown.

This solution is fully integrated and avoids the need to use a "T" bias circuit at the output of the distributed amplifier.

However, as already explained, these distributed power amplifiers necessitate very high bias currents, in excess of 100 mA.

These very high bias currents necessarily lead to constraints regarding heating, making it necessary to use a very large drain resistance Rd, which has a very high stray capacitance. This high stray capacitance causes problems, especially at microwave frequencies, at which the resistance Rd no longer behaves as a pure resistance and the effect of the stray capacitance is no longer negligible.

Accordingly, over time, because of the heating of the resistance caused by the high bias current, the resistance no longer operates in its linear area. This behavior is also encountered in HF operation.

The performance of the resistance Rd is therefore degraded and the bias current of the transistors distributed along the output line DL of the distributed amplifier is no longer stable and is subject to strong fluctuations.

Furthermore, the specifications of the resistance degrade over time because of the high bias currents, its value diverging from the value of the characteristic impedance of the output line DL so that impedance matching is no longer obtained at the output of the power amplifier.

This strongly degrades the performance of the amplifier.

The following numerical example illustrates the phenomenon of power dissipation in the resistance Rd. Consider a bias current Id=200 mA and a resistance Rd=50 Ω.

The voltage drop Urd across the resistance Rd is therefore equal to 10 V and the power dissipated in the resistance Rd is $Pd=Rd.Id^2=2$ W.

Thus, although the power really needed for the amplifier is merely 1.4 W for a 7 V, 200 mA bias source, the bias voltage actually required is Vd=17 V and the total power consumption, to take account of the voltage drop across Rd and the power dissipated in Rd, is 3.4 W. Thus the supply voltage is increased from 7 V to 17 V and the power consumed from 1.4 W to 3.4 W.

The bias voltage and the power dissipation are therefore higher than is strictly necessary.

Finally, because of the resulting temperature rise, the power dissipated in the power amplifier integrated circuit can cause problems with component encapsulation.

Accordingly, one object of the present invention is to provide a biasing system suitable for broad-band power applications.

In particular, an object of the invention is to provide a biasing system capable of delivering the current necessary for biasing all the transistors of a distributed amplifier, combined with optimum impedance matching at the output of the amplifier, without degrading the specifications and performance of the power amplifier anywhere in the range of operating frequencies.

To this end, to solve the above problems, the invention uses a broad-band distributed active load as a bias supply, in particular for distributed power amplifiers, although this application is in no way restricting on the scope of the invention.

More generally, the biasing system according to the invention can be used as the bias supply in any type of broad-band power application requiring high bias currents.

SUMMARY OF THE INVENTION

The invention therefore provides a biasing system for biasing an electronic circuit, the system including a resistance connected in series with a transmission line which has a characteristic impedance substantially equal to the resistance and comprises a conductive line and a plurality of current sources distributed along the conductive line.

In one embodiment of the invention each current source includes a field-effect transistor whose gate and source are connected together and to the conductive line to maintain a constant current from its drain to its source.

In order to make the characteristic impedance of the transmission line independent of frequency, parameters of the line are advantageously determined so that they conform to the following condition:

$$\frac{L}{R} = \frac{C}{G}$$

where L is the value of the inductance between two stages of the transmission line, R represents the losses of the inductance or line losses between two stages, G is the drain-source conductance of the current source, and C is the drain-source capacitance of the current source.

The invention also provides a power amplifier biased by the biasing system as just described.

Other features and advantages of the invention will become more clearly apparent on reading the following description of one particular embodiment of the invention, which is given by way of non-limiting example only and with reference to the accompanying drawings.

DETAILED DESCRIPTION OF THE PREFERRED EMBODIMENT

Figure 4:
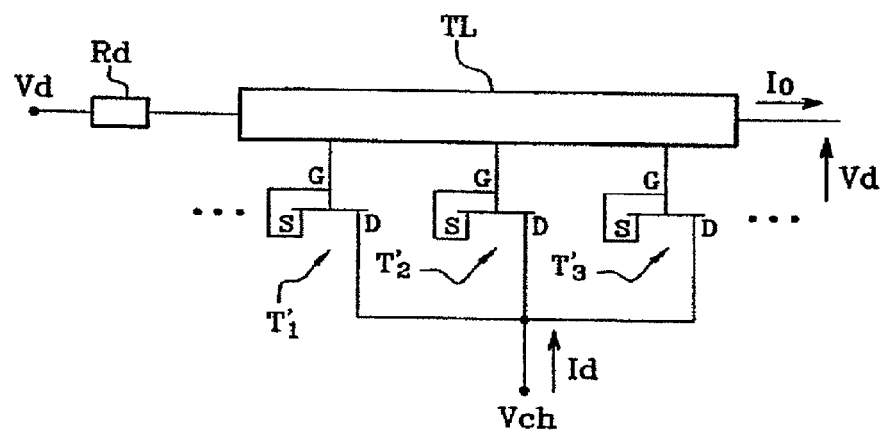
FIG. 4 is a diagram showing a distributed active load used as a bias supply in accordance with the present invention.

Referring to FIG. 4, the distributed active load according to the invention includes a resistance Rd connected in series with a transmission line comprising a conductive line TL and current sources distributed along it. FIG. 4 shows three current sources T'1, T'2, T'3 by way of non-limiting example.

Figure 1:
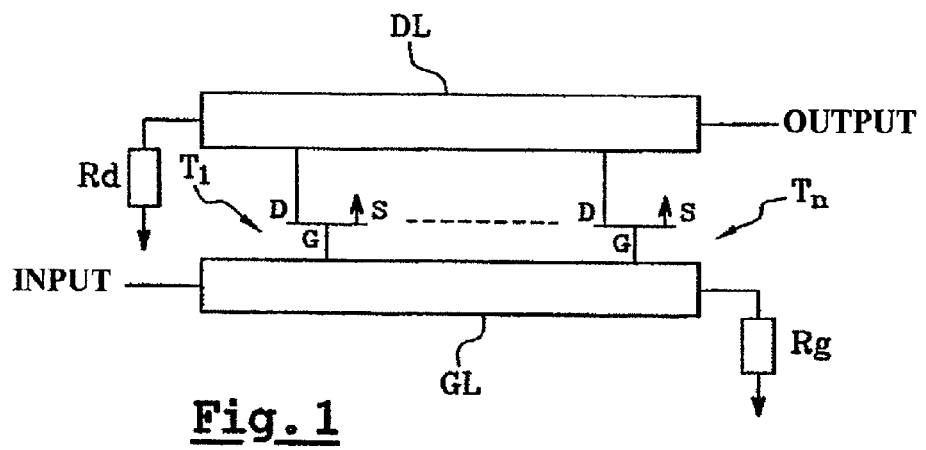
FIG. 1 is a diagram showing the operation of a distributed power amplifier and has already been described.
Figure 2:
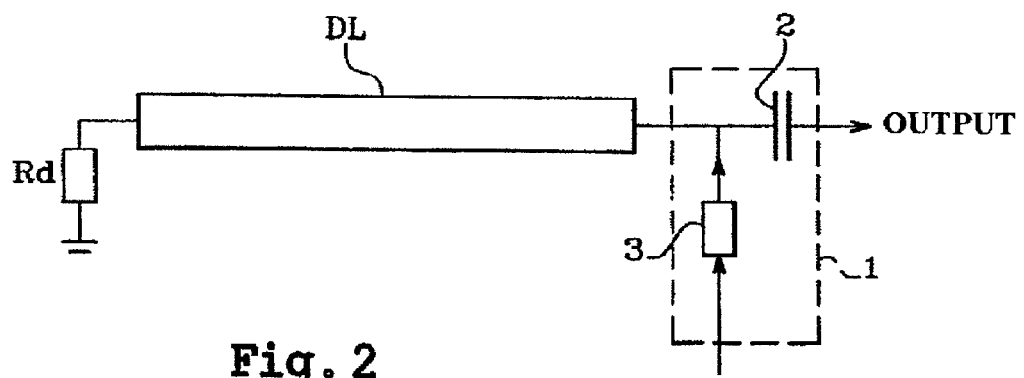
FIG. 2 is a diagram showing a first prior art method of biasing a distributed amplifier and has already been described.
Figure 3:
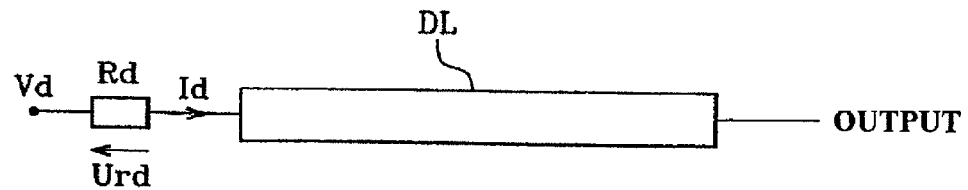
FIG. 3 is a diagram showing a second prior art method of biasing a distributed amplifier and has already been described.

The system according to the invention can be used to bias a distributed power amplifier like that shown in FIG. 1. More generally, it can be used to bias any standard or non-standard type of distributed amplifier.

Each current source advantageously comprises a field-effect transistor (in a different embodiment, each current source can comprise a bipolar transistor).

The transmission line has a characteristic impedance Zc substantially equal to the value of the resistance Rd. The characteristic impedance of the transmission line includes the impedance of the conductive line TL and the equivalent impedances of the transistors connected to it.

The gate electrode G and source electrode S of each field-effect transistor T'1, T'2, T'3 are connected together to maintain a constant drain-source current and are connected to the transmission line TL.

Accordingly, each transistor operates in saturation mode, and the output current is therefore insensitive to the bias voltage.

The drain electrode D of each transistor is connected to a voltage Vch for biasing the transistors of the active load.

The supply voltage of the transistors in the amplifier portion is set by the voltage Vd.

The field-effect transistors T'1, T'2, T'3 used as an active load are therefore distributed along the line TL and the resultant system forms a distributed active load between the resistance Rd and the drain line DL of a distributed power amplifier as shown in FIG. 1 when the system according to the invention is used as a current source for this type of amplifier.

The distributed active load in accordance with the invention combines two essential functions implemented by the same means.

First of all, the function of the distributed active load is to bias the various transistors of the distributed power amplifier.

The bias current Id of the transistors of the amplifier is then delivered by the distributed active load and accordingly virtually no direct current flows through the resistance Rd.

Because no current or practically no current flows through Rd, the resistance Rd is no longer heated, the prior art problems induced by this heating (already referred to earlier in the description) are avoided, and the thermal stability of the amplifier is therefore greatly improved.

There is also the advantage that regardless of the output current of the active load for biasing the amplifier, the voltage at the transistors of the distributed stages is not modified, which improves the linearity of the amplifier.

Also, the bias current Id delivered by the biasing system according to the invention can be varied.

Accordingly, the bias current can be adapted by removing stages from or adding stages to the distributed active load.

For example, if a bias current of 200 mA is necessary in an application and each transistor of the active load distributed along the transmission line TL is designed to deliver 10 mA, then twenty transistors are required to obtain the required distributed active load.

Finally, the bias current supplied by the distributed active load in accordance with the invention is much more stable, especially compared to the most usual prior art solution in which the transistors of the power amplifier are biased directly via the resistance Rd. this significantly improves the linearity of the amplifier. Its performance is therefore also improved.

A second advantageous function of the distributed active load according to the invention used as a current source of a distributed power amplifier is conformance of the drain line of the amplifier to the characteristic impedance, so as to have the same value of the resistance Rd loading the drain line of the distributed amplifier throughout the range of operating frequencies of the amplifier, from DC up to frequencies in excess of 60 GHz.

In fact, with respect to load matching, the distributed active load can be regarded as similar to a simple transmission line.

The characteristic impedance of the transmission line, including the impedance of the conductive line TL and the equivalent impedances of the current sources T'1, T'2, T'3 is made substantially equal to the value of the resistance Rd, which is 50 Ω in this example. The distributed active load being loaded at the input by the resistance Rd, the same resistance value is then found at the output of the distributed active load, i.e. at the input of the distributed amplifier.

Accordingly, the drain line of the distributed power amplifier, the characteristic impedance of which is equivalent to the value of the resistance Rd, is always impedance matched.

If this were not the case, i.e. if impedance matching were not obtained or the drain line of the distributed amplifier were not loaded by a load equal to the value of the resistance Rd, considerable reflection and ripple would occur and much energy would be lost.

To match the impedance at the output of the distributed amplifier the total length of the transmission line of the distributed active load in accordance with the invention is therefore calculated so that the characteristic impedance of the distributed active load is equal to the value of the resistance Rd.

Figure 5:
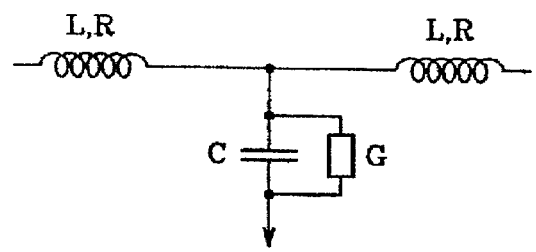
FIG. 5 is a diagram showing an equivalent electrical circuit of one stage of the distributed active load according to the invention.

FIG. 5 shows the equivalent electrical circuit of one stage of the distributed active load.

The transmission line between two consecutive stages of the distributed active load can be modeled by an inductive coil and each active load is modeled by its drain-source capacitance and drain-source conductance.

The characteristic impedance of the distributed active load according to the invention can then be calculated from the following equation:

$$Zc = \sqrt{\frac{R + jLw}{G + jCw}}$$

In the above equation:

L is the value of the inductance between two stages of the transmission line;

R represents the losses of the inductance or line losses between two stages;

G is the drain-source conductance of the active load; and

C is the drain-source capacitance of the active load, which allows for the capacitance of the transmission line to which the active load is connected.

The conditions governing the parameters of the transmission line that have to be satisfied to make the characteristic impedance Zc independent of frequency, and therefore to allow impedance matching of the distributed power amplifier over the widest possible frequency band, are fixed by the following equation linking the variables defined above:

$$\frac{L}{R} = \frac{C}{G}$$

Accordingly, by choosing appropriate values for R, L, G and C, an artificial transmission line is produced with the required constant characteristic impedance, which is equal to 50 Ω in this example, over a wide frequency range, to provide very broad-band amplifier impedance matching. The load seen at the input of the amplifier is therefore practically the same over a very wide frequency band.

In practical terms, computer-assisted design software is used to adjust the physical dimensions of the transmission line to obtain the required result.

The number of stages distributed along the transmission line depends on the direct current that the distributed active load has to deliver.

The system according to the invention therefore solves the main problems encountered with distributed power amplifiers, in particular the need to use a high bias current and broad-band impedance matching without degrading the performance of the amplifier, thanks to the distributed characteristic of the active load used as a bias supply.

Moreover, the invention can use low bias voltage supplies for the distributed power amplifiers, compared to those used in the prior art, in particular if the biasing is effected directly via the resistance Rd.

Accordingly, this feature not only minimizes consumption and heat dissipation but also caters for the standard power supply voltages of 5 V and 12 V.

Finally, the biasing system in accordance with the invention is fully integrated and does not necessitate the use of any module external to the integrated circuit containing the distributed power amplifier.

All of the foregoing description relates to biasing a distributed power amplifier, but it is clear that, without departing in any way from the scope of the present invention, a system as described can be used to bias other electronic circuits having a distributed structure and broad-band and even low-noise power applications.

What is claimed is:

1. A biasing system for biasing an electronic circuit, said system comprising a resistance connected in series with a transmission line which has a characteristic impedance substantially equal to said resistance and comprises a conductive line and a plurality of current sources distributed along said conductive line, wherein each current source is configured to maintain a substantially constant current.

2. The system claimed in claim 1 wherein each current source includes a field-effect transistor whose gate and source are connected together and to said conductive line to maintain a substantially constant current from its drain to its source.

3. The system claimed in claim 2 wherein, in order to make the characteristic impedance of said transmission line substantially independent of frequency, parameters of said line are determined so that they substantially conform to the following condition:

$$\frac{L}{R} = \frac{C}{G}$$

where L is the value of the inductance between two stages of the transmission line, R represents the losses of the inductance or line losses between two stages, G is the drain-source conductance of the current source, and C is the drain-source capacitance of the current source.

4. The system claimed in claim 1, wherein the bias current delivered by said system is variable by adding or removing current sources to or from the plurality of current sources.

5. A power amplifier biased by the system claimed in claim 1.

6. A distributed power amplifier biased by the system claimed in claim 1.

7. The system claimed in claim 1, wherein each current source is a substantially ideal current source.

8. The system claimed in claim 1, wherein the system is configured to be fully integrated.

9. The system claimed in claim 1, wherein the system is configured so that substantially no direct current flows through the resistance.

10. The amplifier claimed in claim 6, wherein the biasing system is configured so that the current from the plurality of current sources will not modify a voltage at transistors of distributed stages of the amplifier.

11. A method of manufacturing a biasing system for an electronic circuit, comprising:

providing the biasing system, wherein the system comprises a resistance connected in series with a transmission line which has a characteristic impedance substantially equal to said resistance and comprises a conductive line and a plurality of current sources distributed along said conductive line, wherein each current source is configured to maintain a substantially constant current; and selecting the number N of the plurality of current sources, wherein each current source is configured to deliver a current EC and the system is configured to deliver a desired total current TC by calculating N equals TC divided by EC.

* * * * *